United States Patent
Kitagawa et al.

(10) Patent No.: US 6,767,435 B1
(45) Date of Patent: Jul. 27, 2004

(54) BRIGHT SURFACE STRUCTURE AND A MANUFACTURING METHOD THEREOF

(75) Inventors: Naoaki Kitagawa, Zushi (JP); Shinichi Okabe, Yamato (JP)

(73) Assignee: Topy Kogyo Kabushiki Kaisha, Tokyo (JP)

( * ) Notice: Subject to any disclaimer, the term of this patent is extended or adjusted under 35 U.S.C. 154(b) by 118 days.

(21) Appl. No.: 09/662,937

(22) Filed: Sep. 15, 2000

(30) Foreign Application Priority Data

Sep. 17, 1999 (JP) .......................... H11-264172
Sep. 24, 1999 (JP) .......................... H11-270072

(51) Int. Cl.⁷ .................. C23C 14/34; C23C 14/14; B05D 1/36
(52) U.S. Cl. .................. 204/192.15; 204/192.38; 427/431; 427/404; 427/419.1; 427/409; 427/410
(58) Field of Search .............. 204/192.38, 192.15, 204/192.16; 427/531, 404, 419.1, 409, 410; 428/332, 457, 458, 461, 31, 418; 164/120; 420/418, 535

(56) References Cited

U.S. PATENT DOCUMENTS

| | | | |
|---|---|---|---|
| 3,847,599 A | * 11/1974 | Hartline ...................... 75/122 |
| 4,112,190 A | 9/1978 | Sato et al. |
| 4,367,307 A | * 1/1983 | Hirai et al. |
| 4,369,225 A | * 1/1983 | Manabe et al. ............. 428/334 |
| 5,227,451 A | * 7/1993 | Tsuge et al. .................. 528/59 |
| 5,264,032 A | * 11/1993 | Dietz et al. ................. 106/411 |
| 5,296,056 A | * 3/1994 | Jain et al. ................... 148/421 |
| 5,656,335 A | * 8/1997 | Schwing et al. ............ 427/447 |
| 6,068,890 A | * 5/2000 | Kaumle et al. ............. 427/534 |
| 6,096,426 A | * 8/2000 | Mokerji ...................... 428/412 |
| 6,168,242 B1 | * 1/2001 | Mokerji ..................... 301/37.1 |

FOREIGN PATENT DOCUMENTS

| | | |
|---|---|---|
| EP | 0 635 582 A1 | 7/1994 |
| GB | 1 573 008 | 12/1976 |
| JP | 4-131232 | 5/1992 |
| JP | 10-130822 | 5/1998 |

* cited by examiner

Primary Examiner—Steven VerSteeg
(74) Attorney, Agent, or Firm—Pillsbury Winthrop LLP

(57) ABSTRACT

A bright surface structure formed on a member made from metal or resin. A first structure includes: (a) a resin film coated on the member, and (b) a thin metal film formed on the resin film. The thin metal film is made from any one of stainless steel, titanium alloy and nickel alloy. A second structure further includes (c) a clear protective film coated on the thin metal film. A third structure includes: (b') a thin metal film formed on the resin film of (a), and (c') a clear colored protective film coated on the thin metal film of (b'). The thin metal film of (b') is made from any one of stainless steel, titanium alloy, nickel alloy, aluminum, titanium and chromium.

12 Claims, 1 Drawing Sheet

BRIGHT SURFACE STRUCTURE AND A MANUFACTURING METHOD THEREOF

This application is based on and claims priority from Japanese Patent Application Nos. H11-264172 filed on Sep. 17, 1999 and H11-270072 filed on Sep. 24, 1999, the contents of which are incorporated herein by reference.

BACKGROUND OF THE INVENTION

1. Field of the Invention

The present invention relates to a bright surface structure formed on a member made from metal or resin and having a good ductility and corrosion resistance, and a method for manufacturing thereof.

2. Description of Related Art

To brighten a surface of a metal or a resin member, conventionally an electro plating, such as an electro chromium plating is used. By this method, a high reflectivity, a gloss of a high degree having an appearance of deepness, a good wearing resistance and a good corrosion resistance are obtained. This surface brightening treatment is applied to a metal member such as an aluminum wheel of an automobile, and a resin member such as a front grille, a garnish and an emblem of an automobile for lightening the member.

Since the electro plating needs an environmental countermeasure, recently various methods replacing the electro plating have been investigated. As one substituting method, with the aluminum wheel of an automobile, a surface of the wheel is ground to a smooth surface. However, the grinding is not only accompanied by an increase in manufacturing cost but also inapplicable to an inside surface of ventilation holes of the wheel.

Japanese Patent Publications H04-131232 and H10-130822 propose the following improving methods replacing the grinding method:

(1) Japanese Patent Publication H04-131232

After a metal member is surface-treated, the member is coated with an under coat, then a thin chromium film formed by sputtering, and then a top coat. A surface of the thin chromium film operates as a reflective surface. In the surface treatment, the surface of the member is shot-blasted and coated with a clear resin by powder coating. As the under coat, a clear resin film is formed. The chromium film is formed using chromium. The top coat is a clear coat that protects bright surface of the chromium film.

However, the method described in Japanese Patent Publication H04-131232 presents a problem of the thin chromium film cracking, though thin chromium film presents an external appearance similar to electro chromium plating. Because the residual stress of the chromium film is large, cracking is caused during sputtering and after the top coat is coated, or after the top coat is coated on the chromium film and dried. When the thickness of the chromium film is equal to or greater than 0.04 μm, the crack initiation is severe. The residual stress is so significant that when a stress generated in the top coat during abrasion test and weather resistance test is transmitted to the chromium film, cracking easily occurs in the chromium film. Further, when a solvent penetrates the chromium film during coating and/or drying the top coat, cracking easily occurs in the chromium film.

If the chromium film is reduced in thickness in order to suppress generation of the cracks in the chromium film, the external appearance similar to electro chromium plating cannot be obtained any longer because an under wheel surface is seen through the thin chromium coat and the brightness of chromium film is reduced.

(2) Japanese Patent Publication H10-130822

After a powder coating is applied to an aluminum forging part, an under coat, then a thin aluminum film formed by sputtering, and then a top coat are formed. A surface of the thin aluminum film operates as a reflective surface.

However, the method described in Japanese Patent Publication H10-130822 presents a problem that corrosion resistance is relatively low, though no cracks occur even if the aluminum film has a thickness of about 0.08 μm, since aluminum film has a high ductility. Though the top resin coat formed on the aluminum film protects the aluminum film, once the top coat is damaged during lifetime of an automobile, corrosion propagates from the damaged top coat. When the aluminum film is removed due to the corrosion, the brightness is gone.

SUMMARY OF THE INVENTION

The present invention provides for a bright surface structure formed on a metal or resin member having an external surface similar to an electro chromium plating, and a good ductility and corrosion resistance, and a method for manufacturing thereof.

BRIEF DESCRIPTION OF THE DRAWINGS

The above discussed and other objects, features, and advantages of the present invention will become more apparent and will be more readily appreciated from the following detailed description of the preferred embodiments of the present invention in conjunction with the accompanying drawings, in which.

DETAILED DESCRIPTION OF THE PREFERRED EMBODIMENTS

Figure 1:
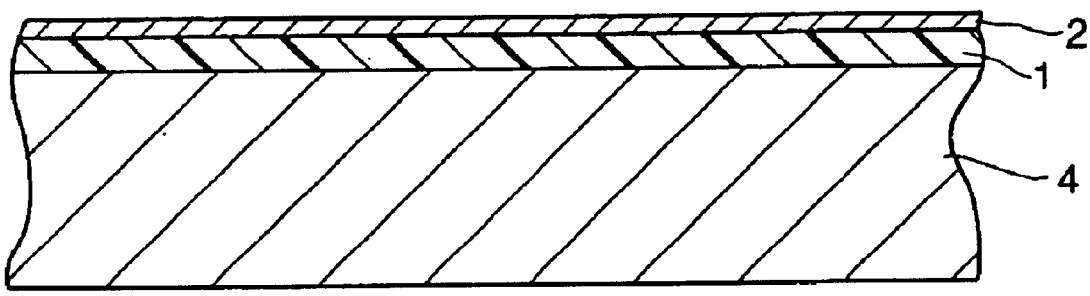
FIG. 1 is a cross-sectional view of a bright surface structure according to the first embodiment of the present invention and manufactured by a method according to the fourth embodiment of the present invention.
Figure 2:
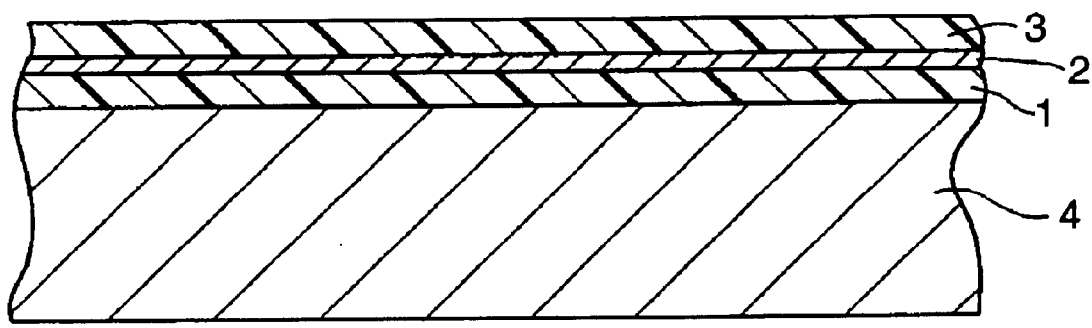
FIG. 2 is a cross-sectional view of a bright surface structure according to the second embodiment of the present invention and manufactured by a method according to the fifth embodiment of the present invention.
Figure 3:
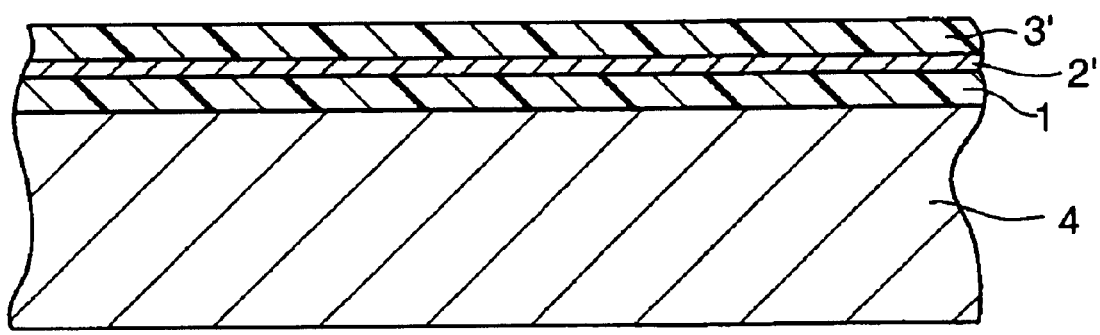
FIG. 3 is a cross-sectional view of a bright surface structure according to the third embodiment of the present invention and manufactured by a method according to the sixth embodiment of the present invention.

FIG. 1 illustrates a bright surface structure according to the first embodiment of the present invention and obtained by a manufacturing method for a bright surface structure according to the fourth embodiment of the present invention. FIG. 2 illustrates a bright surface structure according to the second embodiment of the present invention and obtained by a manufacturing method for a bright surface structure according to the fifth embodiment of the present invention. FIG. 3 illustrates a bright surface structure according to the third embodiment of the present invention and obtained by a manufacturing method for a bright surface structure according to the sixth embodiment of the present invention.

Portions common or similar to each other throughout all of the embodiments of the present invention are denoted with the same reference numerals throughout all of the embodiments of the present invention.

As illustrated in FIG. 1, a bright surface structure formed on a member 4 made from metal or resin according to the first embodiment of the present invention includes (a) a resin film 1 coated on the member 4, and (b) a thin metal film 2 formed on the resin film 1. The thin metal film 2 is made from material selected from the group consisting of stainless steel, titanium alloy and nickel alloy and has a smooth surface.

As illustrated in FIG. 2, a bright surface structure formed on a member 4 made from metal or resin according to the second embodiment of the present invention further includes (c) a clear (transparent) protective film 3 coated on the thin metal film 2, in addition to the bright surface structure according to the first embodiment of the present invention.

As illustrated in FIG. 3, a bright surface structure formed on a member 4 made from metal or resin according to the third embodiment of the present invention includes (a) a resin film 1 coated on the member 4, (b') a thin metal film 2' formed on the resin film 1, and (c') a clear (transparent) colored protective film 3' coated on the thin metal film. The thin metal film 2' is made from material selected from the group consisting of stainless steel, titanium alloy, nickel alloy, aluminum, titanium and chromium and has a smooth surface.

As illustrated in FIG. 1, a method for manufacturing a bright surface structure formed on a member 4 made from metal or resin according to the fourth embodiment of the present invention includes (a) coating a resin film 1 on the member 4 such that the resin film 1 has a smooth surface, (b) forming a thin metal film 2 on the resin film 1. The thin metal film 2 is made from material selected from the group consisting of stainless steel, titanium alloy and nickel alloy and has a smooth surface.

As illustrated in FIG. 2, a method according to the fifth embodiment of the present invention further includes (c) coating a clear protective film 3 on the metal film 2, in addition to the method according to the fourth embodiment of the present invention.

As illustrated in FIG. 3, a method for manufacturing a bright surface structure formed on a member 4 made from metal or resin according to the sixth embodiment of the present invention includes (a) coating a resin film 1 on the member 4 such that the resin film 1 has a smooth surface, (b') forming a thin metal film 2' on the resin film 1, and (c') coating a clear colored protective film 3' on the thin metal film 2'. The thin metal film 2' is made from material selected from the group consisting of stainless steel, titanium alloy and nickel alloy, aluminum, titanium and chromium and has a smooth surface.

In any of the first through the sixth embodiments of the present invention, the member 4 may be a metal member, such as an aluminum wheel of an automobile, or a resin member, such as a front grille, a garnish and an emblem of an automobile.

In the preferred embodiments, the stainless steel is austenitic stainless steel; the titanium alloy contains 20–80% by weight of titanium and 20–80% by weight of aluminum; the nickel alloy contains 30–80% by weight of nickel and 15–25% by weight of chromium.

Preferably, when the thin metal film 2 or 2' is made from stainless steel or titanium alloy, the thin metal film 2, 2' has a thickness of 0.03–1.0 $\mu$m, and when the thin metal film 2 or 2' is made from a nickel alloy, the thin metal film 2 or 2' has a thickness of 0.03–0.5 $\mu$m.

Preferably, the clear protective film 3 has a thickness of 5–20 $\mu$m.

Preferably, the clear colored protective film 3' has a thickness of 20–40$\mu$m.

Preferably, the clear colored protective film 3' is made from a clear resin comprising a pigment or a dye. The clear resin is any one of acrylic resin-based, urethan-based and epoxy-based resins. The pigment is any one of carbon-based, lead chromate-based, iron(II) ferrocyanide-based, cobalt-based, and chromium oxide-based pigments. The pigment is also any one of thren-based, quinacrine staining-based, isoindolinone-based or metal complex pigment. The dye is any one of acid dyes, mordant dyes, basic dyes, disperse dyes, edible dyes, direct dyes and sulphur dyes.

Preferably, the resin film 1 is formed by powder coating.

Preferably, the thin metal film 2, 2' is formed by cathode-arc-type ion plating or sputtering.

Each of the films 1, 2, 2', 3 and 3' in the first through the sixth embodiments of the present invention will be explained in more detail.

(a) Resin Film 1

The resin film 1 coated on the metal or resin member 4 is required to have a good adhesion to the member 4, to have a smooth surface so that the thin metal film 2, 2' formed on the resin film 1 has a smooth surface and has a high reflectivity, and to have a good adhesion with the thin metal film 2, 2'. Any one of polyester-based, epoxy-based, acrylic resin-based, and urethan-based resins can be used as material for the resin film 1. Any color may be used. As long as the above requirement is satisfied, the resin film 1 may be of any thickness.

(b) Thin Metal Film 2 and (b') Thin Metal Film 2'

A material for the thin metal film 2 is selected from stainless steel, titanium alloy and nickel alloy. The thin metal film 2 made from any one of these materials has an external appearance similar to that of electro chromium plating and has a good ductility (crack resistance) and a good wear resistance.

As the stainless steel, austenitic stainless steel is preferable. Martensitic stainless steel and ferritic stainless steel is inferior to austenitic stainless steel in an external appearance, ductility and wear resistance. Therefore, a thickness of the thin metal film 2, 2' is determined taking into account the kind of stainless steel used for the thin metal film.

It is preferable that the titanium alloy for the thin metal film 2, 2' contains 20–80% by weight of titanium. In case the alloy contains less than 20% by weight of titanium, the wear resistance of the thin metal film 2, 2' will decrease though the brightness is maintained, so that during salt water spray test, the metal film will be melted. In case the alloy contains more than 80% by weight of titanium, the brightness of the thin metal film 2, 2' is suppressed and the color of the thin metal film 2, 2' approaches that of chromium, and during warm water immersion test, an oxidized film is generated at the surface to produce an interference color. The titanium alloy containing 20–80% by weight of aluminum is more preferable. The contained aluminum makes higher ductility and reflectivity of the titanium alloy.

It is preferable that the nickel alloy for the thin metal film 2, 2' contains 30–80% by weight of nickel. In case the alloy contains less than 30% by weight of nickel, the color of the thin metal film 2, 2' approaches the chromium color, suppressed in brightness and becomes harder to decrease in crack resistance. In case the alloy contained more than 80% by weight of nickel, the thin metal film 2, 2' has excessive brightness. A nickel-chromium alloy containing about 30% by weight of nickel and 15–25% by weight of chromium is more preferable.

With respect to a thickness of the thin metal film 2, 2', in case of the stainless steel film and the titanium alloy film, a thickness of 0.03–1.0 $\mu$m is preferable, and in case of nickel alloy film, 0.03–0.5 $\mu$m is preferable. In case a thickness is less than 0.03 μm, the under resin film 1 can be seen through the metal film and a high reflectivity cannot be achieved. In case the thickness is more than the above respective upper limits, cracks are generated due to the residual stress in the film, and further, a time period for forming the thin metal film becomes long and the productivity decreases.

(c) Clear Protective Film 3

In order to increase the wear resistance and the corrosion resistance and to obtain an external appearance similar to that of electro chromium plating, a clear (transparent) protective film 3 is formed on the thin metal film 2. The clear protective film 3 is required to have a good adhesion to the thin metal film 2 and a good weather resistance so as to maintain the transparency for prolonged time periods. A coating paint used for forming the clear protective film 3 is any one of acrylic resin-based, urethan-based and epoxy-based resins. A thickness of the clear protective film 3 is conventionally 20–40 μm, but in the present invention, since the thin metal film 2 has a high corrosion resistance, a thickness of the clear protective film 3 can be 5–20 μm and obtain satisfactory wear resistance. Further, since the entire surface of the thin metal film 2 is not necessarily coated with the clear protective film 3, the brightening treatment cost can be decreased.

(c') Clear Colored Protective Film 3'

In order to increase the wear resistance and the corrosion resistance and to obtain an external appearance similar to that of electro chromium plating, a clear (transparent) colored protective film 3' is formed on the thin metal film 2. The clear colored protective film 3' is required to have a good adhesion to the thin metal film 2 and a good weather resistance so as to maintain the transparency for prolonged time periods. A coating paint used for forming the clear colored protective film 3' is any one of acrylic resin-based, urethan-based and epoxy-based resins.

The (clear resin) paint comprises a pigment or a dye to give a good external appearance to the member 4.

There are two kinds of pigments: an inorganic pigment and an organic pigment. The inorganic pigment includes a natural pigment and an artificial pigment, and are stable in color. A carbon-base offers black, a lead chromate-base offers yellow, an iron(II) ferrocyanide-base offers blue, a cobalt-base offers blue, and a chromium oxide-base offers green. The organic pigment includes a thren-based (which offers red, blue, orange and purple), a quinacrine staining-based (which offers red, magenta, purple and yellow), an isoindolinone-based (which offers yellow and red), and metal complex pigments (which offers yellow and green).

The dyes are classified into an acid dye, a mordant dye, a basic dye, a disperse dye, an edible dye, a direct dye and a sulphur dye and can offer yellow, orange, red, purple, blue, green, brown and black. The dyes are also classified by a chemical structure into nitro, azo, diphenyl, triphenylmethan, xanthene, azine, indigo, and anthraquinone.

The organic pigment and the dyes are especially suitable for achieving the high reflectivity of the under thin metal film 2'. The diameter of a pigment or dye particle is preferably 0.1–30 μm.

The thickness of the clear colored protective film 3' is 20–40 μm.

Each step of the method according to the fourth through the sixth embodiments of the present invention will be explained in more detail.

(a) Formation of the Resin Film 1

A roughness of the surface of the metal or resin member 4 varies from a mirror surface to a pear-skin. The surface is cleaned and degreased, and in some cases is conversion-treated to form an oxidized film at the surface, and then the surface is coated with the resin film 1. Using a solvent based paint where a resin paint is dissolved in a solvent, a water based paint or powder paint, the resin film 1 is formed, by immersing the member 4 in the paint, injecting the paint to the member 4, or powder-coating. In the case where the member 4 has a surface with a roughness of 100–200 μm, as in case of a cast, the powder coating is preferable. In the powder coating, electrostatic coating is conducted and the adhering paint is baked at above 100° C., so that even the surface with a large roughness is smoothed. The powder coated surface may be further sprayed by a solvent base paint to get a further smoothed surface.

(b) Formation of the Thin Metal Film 2 and Formation of the Thin Metal Film 2'

A cathode arc-type ion plating or sputtering is preferable for forming the thin metal film 2, 2'. The cathode arc-type ion plating is a method where by generating an arc discharge in a vacuum, a target is locally evaporated. The sputtering is a method where an argon ion collides with a target in a vacuum to eject out an atom of the target. Therefore, the same metal as the target forms the thin metal film 2, 2'.

(c) Formation of the Clear Protective Film 3

To form the clear protective film 3, a solvent based paint of any one of acrylic-based, urethan-based and epoxy-based resins is injected by air onto the thin metal film 2.

(c') Formation of the Clear Colored Protective Film 3'

To form the clear colored protective film 3', a pigment of dye of a desired color is selected and the selected pigment or dye is added to and mixed with the solvent based paint of any one of acrylic-based, urethan-based and epoxy-based resins. Then, the paint with the pigment or dye is injected by air onto the thin metal film 2'.

Tests were conducted to confirm that the bright surface structures according to the present invention have the desired properties. Among the following test examples, Examples 2, 4, 6, 8, 10, 12, 14, 16, 18, 20, 22, 24 and 26 correspond to the first and the fourth embodiments of the present invention; Examples 1, 3, 5, 7, 9, 11, 13, 15, 17, 19, 21, 23 and 25 correspond to the second and the fifth embodiments of the present invention; and Examples 27–32 correspond to the third and the sixth embodiments of the present invention.

EXAMPLE 1

An aluminum alloy cast AC4C (Al—Si—Mg based) was used as a base material (metal member 4). This material was cast, having surface roughness of 100–200 μm.

Then, a chemical conversion coating was formed at the surface of the base material to increase a corrosion resistance. Then, an electrostatic epoxy powder coating was performed using the electric voltage condition of 40–60 kV, and the resulting cast was baked at 170° C. for 60 minutes to form a resin film 1 of a thickness of about 120 μm. Further, to obtain a smoother surface, a coating of a solvent based acrylic resin was formed to a thickness of about 25 μm and was baked at 145° C. for 60 minutes.

Then, a thin metal film 2 was formed by DC-magnetron-sputtering using a target of SUS304. The target electric current was 3A, and the vacuum pressure was $2.5 \times 10^{-3}$ Torr. By coating for 30 seconds, the thin metal film 2 of a thickness of about 0.06 μm was obtained.

Then, a clear paint of acrylic resin was coated by spraying on the thin metal film 2 to a thickness of 20 μm and was baked at 80° C. for 60 minutes to obtain a clear protective film 3.

A visual test (visual inspection), a warm water immersion test and a corrosion resistance test were conducted.

According to the visual test, the thin metal film of stainless steel did not exhibit a crack and had an external appearance similar to that of electro chromium plating.

In the warm water immersion test, the test piece was immersed in warm water at 60° C. for 72 hours. As a result of the test, there was no change in the external appearance. Further, a tape was attached to the surface and then detached from the surface. As a result of the tape test, there was no separation of the clear protective film from the thin metal film.

In the corrosion resistance test, the clear protective film was cross-cut and was subjected to a salt water spray test for 1000 hours. As a result of the test, neither corrosion of the thin stainless steel film from the cross-cut portion nor breakage of the thin stainless steel film was observed.

EXAMPLE 2

The same test piece as that of Example 1 was prepared, except that the clear protective film was not formed after formation of the thin stainless steel film.

Then, the same corrosion resistance test as that of Example 1 was conducted. As a result of the test, neither corrosion of the thin metal film from the cross-cut portion nor breakage of the thin metal film was observed.

EXAMPLE 3

The same test piece as that of Example 1 was prepared, except that in formation of the thin metal film a target of SUS316L was used.

Then, the same tests as those of Example 1 were conducted. The visual test, the warm water immersion test and the corrosion resistance test produced the same results as those for Example 1.

EXAMPLE 4

The same test piece as that of Example 3 was prepared, except that the clear protective film was not formed after formation of the thin metal film of stainless steel.

Then, the same tests as those of Example 1 were conducted. The visual test, the warm water immersion test and the corrosion resistance test produced the same results as those for Example 1.

EXAMPLE 5

The same test piece as that of Example 1 was prepared, except that the preparation conditions were changed as follows. In formation of the thin metal film, a cathode arc-type ion plating apparatus was used and the thin metal film of the thickness of about 0.8 $\mu$m was formed. The argon pressure was 30 mTorr, the cathode electric current was 60A, and the coating period of time was 15 minutes. The temperature of the base material was controlled so that the thin metal film formation temperature did not exceed the baking temperature of the under resin film.

Then, the same tests as those of Example 1 were conducted. The visual test, the warm water immersion test and the corrosion resistance test produced the same results as those for Example 1.

EXAMPLE 6

The same test piece as that of Example 5 was prepared, except that the clear protective film was not formed after formation of the thin stainless steel film.

Then, the same corrosion resistance test as that of Example 1 was conducted. As a result of the test, neither corrosion nor breakage of the thin stainless steel film was observed.

EXAMPLE 7

ABS resin (of a plating grade) was used as a base material (member 4). The base material was a mold material, having a smooth surface.

To obtain a reflective surface of as high-degree as an electro plating, the surface of the base material was cleaned and degraded using alcohol. Then, a polyester-based resin film 1 was formed on the base material by spraying to a thickness of 15–25 $\mu$m. The resin film was baked at 75° C. for one hour so that the base material was not deformed.

Then, a thin metal film 2 was formed by DC-magnetron-sputtering using a target of SUS304 to a thickness of about 0.08 $\mu$m. The target electric current was 3A, and the vacuum pressure was $1.5 \times 10^{-3}$ Torr. The film formation time period was 40 seconds.

Then, a clear acrylic resin paint was coated by spraying on the thin metal film 2 to a thickness of 20 $\mu$m and was baked at 70° C. for one hour to obtain a clear protective film 3.

A visual test, a warm water immersion test and a corrosion resistance test similar to those described in Example 1 were conducted, and the same results as those for Example 1 were obtained.

EXAMPLE 8

The same test piece as that of Example 7 was prepared, except that the clear protective film was not formed after formation of the thin stainless steel film.

Then, the same corrosion resistance test as that of Example 1 was conducted. As a result of the test, neither corrosion nor breakage of the thin stainless steel film was observed.

COMPARATIVE EXAMPLE 1

The same test piece as that of Example 1 was prepared, except that a thin aluminum film of a thickness of 0.08 $\mu$m was formed as the thin metal film.

Then, the same corrosion resistance test as that of Example 1 was conducted. As a result of the test, the aluminum at the cross-cut portion disappeared after 200 hours.

COMPARATIVE EXAMPLE 2

The same test piece as that of Comparative Example 1 was prepared, except that a clear protective film was not formed after formation of the thin aluminum film.

Then, the same corrosion resistance test as that of Example 1 was conducted. As a result of the test, the thin aluminum film disappeared after 168 hours.

From the test results of Comparative Example 1 and Comparative Example 2, it was found that the thin aluminum film could not maintain the corrosion resistance if the thin aluminum film was not coated with and protected by the protective film.

COMPARATIVE EXAMPLE 3

The same test piece as that of Example 7 was prepared, except that a thin aluminum film of a thickness of 0.08 $\mu$m was formed as the thin metal film.

Then, the same corrosion resistance test as that of Example 1 was conducted. As a result of the test, the aluminum at the cross-cut portion disappeared after 200 hours (the same as that of Comparative Example 1).

COMPARATIVE EXAMPLE 4

The same test piece as that of Comparative Example 3 was prepared, except that a clear protective film was not formed after formation of the thin aluminum film.

Then, the same corrosion resistance test as that of Example 1 was conducted. As a result of the test, the thin aluminum film disappeared after 168 hours (the same as that of Comparative Example 2).

EXAMPLE 9

The same test piece as that of Example 1 was prepared, except that the preparation conditions were changed as follows. In formation of the thin metal film, a sintered target containing 20% by weight of aluminum and 80% by weight of titanium was used to form the thin metal film of a thickness of about 0.05 μm. The target electric current was 3A, and the film formation pressure was $2.5 \times 10^{-3}$ Torr, and the coating period of time was 3 minutes.

A visual test, a warm water immersion test and a corrosion resistance test were conducted.

According to the visual test, the thin titanium alloy film did not have cracks and had an external appearance similar to that of electro chromium plating.

In the warm water immersion test, there was no change in the external appearance. Further, a tape was attached to the surface and then detached from the surface. As a result of the tape test, there was no separation of the clear protective film from the thin metal film.

In the corrosion resistance test, the clear protective film was cross-cut and was subjected to a salt water spray test for 1000 hours. As a result of the test, neither corrosion of the thin titanium alloy film from the cross-cut portion nor breakage of the thin titanium alloy film was observed.

EXAMPLE 10

The same test piece as that of Example 9 was prepared, except that the clear protective film was not formed after formation of the thin titanium alloy film.

Then, the same corrosion resistance test as that of Example 9 was conducted. As a result of the test, neither corrosion of the thin titanium alloy film from the cross-cut portion nor breakage of the thin titanium alloy film was observed.

EXAMPLE 11

The same test piece as that of Example 9 was prepared, except that in formation of the thin metal film a sintered target containing 50% by weight of aluminum and 50% by weight of titanium-was used.

Then, the same tests as those of Example 9 were conducted. The results of the visual test, the warm water immersion test and the corrosion resistance test were the same as those of Example 9 except that the external appearance was a little brighter than that of Example 9.

EXAMPLE 12

The same test piece as that of Example 11 was prepared, except that the clear protective film was not formed after formation of the thin titanium alloy film.

Then, the same corrosion resistance test as that of Example 9 was conducted. As a result of the test, neither corrosion nor breakage of the thin titanium alloy film was observed.

EXAMPLE 13

The same test piece as that of Example 9 was prepared, except that in formation of the thin metal film a sintered target containing 80% by weight of aluminum and 20% by weight of titanium was used.

Then, the same tests as those of Example 9 were conducted. The results of the visual test, the warm water immersion test and the corrosion resistance test were the same as those of Example 9 except that the color was almost that of pure aluminum and that the reflectivity was high.

EXAMPLE 14

The same test piece as that of Example 13 was prepared, except that the clear protective film was not formed after formation of the thin titanium alloy film.

Then, the same corrosion resistance test as that of Example 9 was conducted. As a result of the test, neither corrosion nor breakage of the thin titanium alloy film was observed.

EXAMPLE 15

The same test piece as that of Example 9 was prepared, except the following test conditions was. In formation of the thin metal film, a sintered target containing 50% by weight of aluminum and 50% by weight of titanium and a cathode arc-type ion plating apparatus were used and the thin metal film of the thickness of about 1 μm was formed. The argon pressure was 30 mTorr, the cathode electric current was 50A, and the coating period of time was 1 hour. The temperature of the base material was controlled so that the thin metal film formation temperature did not exceed the baking temperature of the under resin film.

Then, the same tests as those of Example 9 were conducted. The results of the visual test, the warm water immersion test and the corrosion resistance test were the same as those of Example 9.

EXAMPLE 16

The same test piece as that of Example 15 was prepared, except that the clear protective film was not formed after formation of the thin titanium alloy film.

Then, the same corrosion resistance test as that of Example 9 was conducted. As a result of the test, neither corrosion nor breakage of the thin titanium alloy film was observed.

EXAMPLE 17

ABS resin (of a plating grade) was used as a base material (member 4). The base material was a mold material, having a smooth surface.

To obtain a reflective surface of as high-degree as an electro plating, the surface of the base material was cleaned and degraded using alcohol. Then, a polyester-based resin film 1 was formed on the base material by spraying to a thickness of 15–25 μm. The resin film was baked at 75° C. for one hour so that the base material was not deformed.

Then, a thin metal film 2 was formed by DC-magnetron-sputtering to a thickness of about 0.05 μm using a sintered target containing 50% by weight of aluminum and 50% by weight of titanium. The target electric current was 3A, and the film formation pressure was $2.5 \times 10^{-3}$ Torr. The film formation time period was 3 minutes.

Then, a clear paint of acrylic resin was coated by spraying on the thin metal film 2 to a thickness of 20 μm and was baked at 70° C. for one hour to obtain a clear protective film 3.

A visual test, a warn water immersion test and a corrosion resistance test like Example 9 were conducted, and the same results as those of Example 9 were obtained.

EXAMPLE 18

The same test piece as that of Example 17 was prepared, except that the clear protective film was not formed after formation of the thin titanium alloy film.

Then, the same corrosion resistance test as that of Example 9 was conducted. As a result of the test, neither corrosion nor breakage of the thin titanium alloy film was observed.

EXAMPLE 19

The same test piece as that of Example 1 was prepared, except the following test conditions. A thin metal film 2 was formed by DC-magnetron-sputtering using a melted target of hastelloy X containing 50% by weight of nickel, 22% by weight of chromium, 18.5% by weight of iron, and tungsten and cobalt etc. to a thickness of about 0.05 μm. The target electric current was 3A, and the film formation pressure was $2.5 \times 10^{-3}$ Torr, and the coating period of time was 20 seconds.

A visual test, a warm water immersion test and a corrosion resistance test were conducted.

According to the visual test, the thin nickel alloy film did not have cracks and had an external appearance similar to that of electro chromium plating.

In the warm water immersion test, there was no change in the external appearance. Further, a tape was attached to the surface and then detached from the surface. As a result of the tape test, there was no separation of the clear protective film from the thin metal film.

In the corrosion resistance test, the clear protective film was cross-cut and was subjected to a salt water spray test for 1000 hours. As a result of the test, neither corrosion of the thin nickel alloy film from the cross-cut portion nor breakage of the thin nickel alloy film was observed.

EXAMPLE 20

The same test piece as that of Example 19 was prepared, except that the clear protective film was not formed after formation of the thin nickel alloy film.

Then, the same corrosion resistance test as that of Example 19 was conducted. As a result of the test, neither corrosion of the thin nickel alloy film from the cross-cut portion nor breakage of the thin nickel alloy film was observed.

EXAMPLE 21

The same test piece as that of Example 19 was prepared, except that in formation of the thin metal film a melted target of inconel 600 containing 76% by weight of nickel, 15.5% by weight of chromium, 8.0% by weight of iron, and manganese, silicon, and carbon etc. was used.

Then, the same tests as those of Example 19 were conducted. The results of the visual test, the warm water immersion test and the corrosion resistance test were found to be the same as those of Example 19 except that the external appearance was a little brighter than that of Example 19.

EXAMPLE 22

The same test piece as that of Example 21 was prepared, except that the clear protective film was not formed after formation of the thin nickel alloy film.

Then, the same corrosion resistance test as that of Example 19 was conducted. As a result of the test, neither corrosion nor breakage of the thin nickel alloy film was observed.

EXAMPLE 23

The same test piece as that of Example 19 was prepared, except the following test conditions. In formation of the thin metal film, a melted target of inconel 600 containing 76% by weight of nickel, 15.5% by weight of chromium, 8.0% by weight of iron, and manganese, silicon, and carbon etc. was used and the thin metal film of the thickness of about 0.5 μm was formed. The argon pressure was 30 mTorr, the cathode electric current was 50A, and the coating period of time was 20 minutes. The temperature of the base material was controlled so that the thin metal film formation temperature did not exceed the baking temperature of the under resin film.

Then, the same tests as those of Example 19 were conducted. The results of the visual test, the warm water immersion test and the corrosion resistance test were found to be the same as those of Example 19.

EXAMPLE 24

The same test piece as that of Example 23 was prepared, except that the clear protective film was not formed after formation of the thin nickel alloy film.

Then, the same corrosion resistance test as that of Example 19 was conducted. As a result of the test, neither corrosion nor breakage of the thin nickel alloy film was observed.

EXAMPLE 25

ABS resin (of a plating grade) was used as a base material (member 4). The base material was a mold material, having a smooth surface.

To obtain a reflective surface of as high-degree as an electro plating, the surface of the base material was cleaned and degraded using alcohol. Then, a polyester-based resin film 1 was formed on the base material by spraying to a thickness of 15–25 μm. The resin film was baked at 75° C. for one hour so that the base material was not deformed.

Then, a thin metal film 2 was formed by DC-magnetron-sputtering to a thickness of about 0.05 μm using a melted target of inconel 600 containing 76% by weight of nickel, 15.5% by weight of chromium, 8.0% by weight of iron, and manganese, silicon, and carbon etc. The target electric current was 3A, and the film formation pressure was $2.5 \times 10^{-3}$ Torr. The film formation period of time was 20 seconds.

Then, a clear paint of acrylic resin was coated by spraying on the thin metal film 2 to a thickness of 20 μm and was baked at 70° C. for one hour to obtain a clear protective film 3.

A visual test, a warm water immersion test and a corrosion resistance test like Example 19 were conducted, and the same results as those of Example 19 were obtained.

EXAMPLE 26

The same test piece as that of Example 25 was prepared, except that the clear protective film was not formed after formation of the thin nickel alloy film.

Then, the same corrosion resistance test as that of Example 19 was conducted. As a result of the test, neither corrosion nor breakage of the thin nickel alloy film was observed.

EXAMPLE 27

An aluminum alloy cast AC4C (Al—Si—Mg base) was used as a base material (metal member 4). This material was a cast, having surface roughness of 100–200 µm.

Then, a chemical conversion coating was formed on the surface of the base material to increase corrosion resistance. Then, an electrostatic epoxy powder coating was conducted at the electric voltage condition of 40–60 kV and was baked at 170° C. for 60 minutes to form a resin film 1 of a thickness of about 120 µm. Further, to obtain a smoother surface, a coating of a solvent based acrylic resin was formed to a thickness of about 25 µm and was baked at 145° C. for 60 minutes.

Then, a thin metal film 2' was formed by DC-magnetron-sputtering to a thickness of about 0.05 µm using a melted target of hastelloy X containing 50% by weight of nickel, 22% by weight of chromium, 18.5% by weight of iron, and tungsten and cobalt etc. The target electric current was 3A, and the film formation pressure was $2.5 \times 10^{-3}$ Torr, and the coating period of time was 20 seconds.

Then, a clear colored paint of acrylic resin-silicone-based resin containing a sulphur dye (Sulphur Blue 4R) in the amount of 1% by weight and mixed at 100 rpm for 5 minutes was coated by spraying on the thin metal film 2' to a thickness of 20 µm and was baked at 80° C. for 60 minutes to obtain a clear colored protective film 3'.

A visual test, a warm water immersion test and a corrosion resistance test were conducted.

According to the visual test, the thin nickel alloy film did not cause a crack, had a metallic reflection and had a blue color.

In the warm water immersion test, the test piece was immersed in warm water at 60° C. for 72 hours. As a result of the test, there was no change in the external appearance. Further, a tape was attached to the surface and then detached from the surface. As a result of the tape test, there was no separation of the clear colored protective film from the thin metal film.

In the corrosion resistance test, the clear colored protective film was cross-cut and was subjected to a salt water spray test for 1000 hours. As a result of the test, neither corrosion of the thin nickel alloy film from the cross-cut portion nor breakage of the thin nickel alloy film was observed.

EXAMPLE 28

The same test piece as that of Example 27 was prepared, except that in formation of the thin metal film a target containing 30% by weight of titanium and 70% by weight of aluminum was used.

Then, the same tests as those of Example 27 were conducted. The results of the visual test, the warm water immersion test and the corrosion resistance test were the same as those of Example 27.

EXAMPLE 29

Up to formation of the resin film 1, the same procedure as that of Example 27 was followed.

Then, a thin metal film 2' was formed by a cathode arc-type ion plating apparatus to a thickness of about 0.5 µm using a melted target of inconel 600 containing 76% by weight of nickel, 15.5% by weight of chromium, 8.0% by weight of iron, and manganese, silicon, and carbon etc. The argon pressure was 30 mTorr, the cathode electric current was 50A, and the coating period of time was 20 minutes. The temperature of the base material was controlled so that the thin metal film formation temperature did not exceed the baking temperature of the under resin film.

Then, a clear colored paint of acrylic resin-silicone-based resin containing a mordant dye (Yellow) in the amount of 2% by weight and mixed, was coated by spraying on the thin metal film 2' to a thickness of 20 µm and was baked at 80° C. for 60 minutes to obtain a clear colored protective film 3'. The yellow dye had a good adhesion to the thin metal film containing chromium and iron, etc.

A visual test, a warm water immersion test and a corrosion resistance test were conducted. The similar test results as those of Example 27 were obtained. More particularly, the thin nickel alloy film did not crack and had a metallic reflection, and the nickel alloy film had a gold color due to the metallic reflection and the yellow color.

EXAMPLE 30

ABS resin (of a plating grade) was used as a base material (member 4). The base material was a mold material, having a smooth surface.

To obtain a reflective surface of as high-degree as an electro plating, the surface of the base material was cleaned and degraded using alcohol. Then, a polyester-based resin film 1 was formed on the base material by spraying to a thickness of 15–25 µm. The resin film was baked at 75° C. for one hour so that the base material was not deformed.

Then, a thin metal film 2' was formed by DC-magnetron-sputtering to a thickness of about 0.05 µm using a melted target of inconel 600 containing 76% by weight of nickel, 15.5% by weight of chromium, 8.0% by weight of iron, and manganese, silicon, and carbon etc. The target electric current was 3A, and the film formation pressure was $2.5 \times 10^{-3}$ Torr, and the coating period of time was 20 seconds.

Then, a clear colored paint of acrylic resin-silicone-based resin containing a sulphur dye (Sulphur Yellow GG) in the amount of 2% by weight and mixed for 5 minutes, was coated by spraying on the thin metal film 2' to a thickness of 20 µm and was baked at 80° C. for 60 minutes to obtain a clear colored protective film 3'.

A visual test, a warm water immersion test and a corrosion resistance test were conducted. The test results were the same as those of Example 29.

EXAMPLE 31

Up to formation of the resin film 1, the same procedure as that of Example 27 was followed.

Then, a thin metal (aluminum) film 2' was formed by DC-magnetron-sputtering to a thickness of about 0.08 µm using an aluminum melted target.

Then, a clear colored protective film 3' was formed in the same way as Example 29.

A visual test and a warm water immersion test were conducted. Test results were the same as those of Example 29.

EXAMPLE 32

Up to formation of the thin metal film 2', the same procedure as that of Example 31 was followed.

Then, a clear colored paint of acryl-silicone-based resin containing yellow inorganic pigment of lead chromate in the amount of 5% by weight and mixed at 200 rpm, was coated by spraying on the thin metal film 2' to a thickness of 20 $\mu$m and was baked at 80° C. for 60 minutes to obtain a clear colored protective film 3'.

A visual test and a warm water immersion test were conducted. The similar test results as those of Example 31 were obtained. More particularly, the thin aluminum film did not cause a crack, had a metallic reflection and had a gold color due to the metallic reflection and the yellow color. Further, a grain pattern was seen which offered a design different from that of Example 31.

According to the present invention, the following technical advantages are obtained:

The bright surface structure according to the present invention and the structure manufactured by the method according to the present invention have a good ductility suppressing a crack generation and a good corrosion resistance.

Further, since the structure is manufactured by a dry plating method, the structure and the method therefor do not require any waste water treatment.

Although the present invention has been described with reference to specific exemplary embodiments, it will be appreciated by those skilled in the art that various modifications and alterations can be made to the particular embodiments shown without materially departing from the novel teachings and advantages of the present invention. Accordingly, it is to be understood that all such modifications and alterations are included within the spirit and scope of the present invention as defined by the following claims.

What is claimed is:

1. A method for manufacturing a surface structure formed on an aluminum wheel for an automobile, said method comprising:
   (a) coating a resin film on said aluminum wheel; and
   (b) forming a thin metal film having a color similar to chrome on said resin film, wherein said thin metal film is made from a titanium-aluminum alloy containing 20–50% by weight of titanium and 80–50% by weight of aluminum formed by any one of cathode arc ion plating and sputtering using a sintered target containing 20%–50% by weight of titanium and 80%–50% by weight of aluminum in a vacuum atmosphere.

2. A method according to claim 1, further comprising:
   (c) coating a clear protective film on said metal film.

3. A method according to claim 2, wherein said clear protective film has a thickness of 5–20 $\mu$m.

4. A method for manufacturing a surface structure formed on an aluminum wheel for an automobile, said method comprising:
   (a) coating a resin film on said aluminum wheel;
   (b) forming a thin metal film having a color similar to chrome on said resin film, wherein said thin metal film is made from a titanium-aluminum alloy containing 20–50% by weight of titanium and 80–50% by weight of aluminum formed by any one of cathode arc ion plating and sputtering using a sintered target containing 20%–50% by weight of titanium and 80%–50% by weight of aluminum in a vacuum atmosphere; and
   (c) coating a clear colored protective film on said thin metal film.

5. A method according to any one of claim 1, 2, and 4, wherein said resin film is coated by powder coating.

6. A method according to any one of claims 1, 2 and 4, wherein said thin metal film has a thickness of 0.03–1.0 $\mu$m.

7. A method according to claim 4, wherein said clear colored protective film has a thickness of 20–40 $\mu$m.

8. A method according to claim 4, wherein said clear colored protective film is made from a clear resin comprising a pigment or a dye.

9. A method according to claim 8, wherein said clear resin is selected from one of the group consisting of acryl-based, urethan-based and epoxy-based resins.

10. A method according to claim 8, wherein said pigment is selected from one of the group consisting of carbon-based, lead chromate-based, iron(II) ferrocyanide-based, cobalt-based, and chromium oxide-based pigments.

11. A method according to claim 8, wherein said pigment is selected from one of the group consisting of thren-based, quinacrine staining-based, isoindolinone-based, and metal complex pigments.

12. A method according to claim 8, wherein said dye is selected from one of the group consisting of an acid dye, a mordant dye, a basic dye, a disperse dye, an edible dye, a direct dye and a sulphur dye.

* * * * *

UNITED STATES PATENT AND TRADEMARK OFFICE
CERTIFICATE OF CORRECTION

PATENT NO.    : 6,767,435 B1
DATED         : July 27, 2004
INVENTOR(S)   : Naoaki Kitagawa et al.

It is certified that error appears in the above-identified patent and that said Letters Patent is hereby corrected as shown below:

Title page,
Item [73], Assignee, replace "Topy Kogyo Kabushiki Kaisha, Tokyo (JP)" with
-- Topy Kogyo Kabushiki Kaisha, Tokyo (JP) and Nittosha Co., Ltd., Kanagawa-ken (JP) --

Signed and Sealed this

Thirtieth Day of November, 2004

JON W. DUDAS
*Director of the United States Patent and Trademark Office*